(12) United States Patent
Meier et al.

(10) Patent No.: US 7,649,745 B2
(45) Date of Patent: Jan. 19, 2010

(54) CIRCUIT BOARD INCLUDING STUBLESS SIGNAL PATHS AND METHOD OF MAKING SAME

(75) Inventors: Pascal Meier, Sunnyvale, CA (US); Sanjay Dabral, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 39 days.

(21) Appl. No.: 11/557,709

(22) Filed: Nov. 8, 2006

(65) Prior Publication Data
US 2008/0123273 A1   May 29, 2008

(51) Int. Cl.
*H05K 7/00* (2006.01)
(52) U.S. Cl. .................. 361/760; 361/780; 361/683
(58) Field of Classification Search .......... 361/760, 361/780, 683; 29/830; 228/178; 365/232
See application file for complete search history.

(56) References Cited

U.S. PATENT DOCUMENTS

| | | | | |
|---|---|---|---|---|
| 5,655,290 A | * | 8/1997 | Moresco et al. | 29/830 |
| 5,727,310 A | * | 3/1998 | Casson et al. | 29/830 |
| 6,434,016 B2 | * | 8/2002 | Zeng et al. | 361/760 |
| 6,561,410 B2 | * | 5/2003 | Dabral et al. | 228/178 |
| 7,262,974 B2 | * | 8/2007 | Yang et al. | 361/780 |
| 7,385,792 B2 | * | 6/2008 | Kanayama et al. | 361/18 |
| 7,402,757 B1 | * | 7/2008 | Noujeim | 174/261 |
| 7,466,158 B2 | * | 12/2008 | Hirose | 324/763 |
| 2002/0171127 A1 | * | 11/2002 | Slupe et al. | 257/666 |
| 2003/0062966 A1 | * | 4/2003 | Abo et al. | 333/33 |
| 2004/0071040 A1 | * | 4/2004 | Funaba et al. | 365/232 |

* cited by examiner

*Primary Examiner*—Dean A. Reichard
*Assistant Examiner*—Andargie M Aychillhum
(74) *Attorney, Agent, or Firm*—Grossman, Tucker, Perreault & Pfleger, PLLC

(57) ABSTRACT

A circuit board may include first and second sides, a plurality of circuit board layers between the sides, and a plurality of signal traces located in respective circuit board layers. The circuit board layers and the signal traces may extend from a first component connection region at the first side of the circuit board to a second component connection region at the first side of the circuit board. The signal traces may thus form stubless signal paths through the circuit board between the component connection regions. Of course, many alternatives, variations, and modifications are possible without departing from this embodiment.

12 Claims, 5 Drawing Sheets

CIRCUIT BOARD INCLUDING STUBLESS SIGNAL PATHS AND METHOD OF MAKING SAME

FIELD

The present disclosure relates to circuit boards including signal paths, and more particularly, relates to circuit boards including stubless signal paths.

BACKGROUND

In a computer system, printed circuit boards may include conductive paths that electrically connect electronic components, such as chip packages and connectors, mounted to the circuit boards. The conductive paths may include signal traces that extend along the circuit board to carry data signals between the electronic components. In current circuit board designs with many connections between electronic components (e.g., chip-to-chip connections), multi-layer printed circuit boards include multiple signal traces. Signal paths sometimes must travel from a component on the top of the circuit board to the signal traces in the various layers inside of the circuit board.

Access to the inner layers in a multi-layer printed circuit board may be provided by vias, such as plated through-hole vias (PTHs). Vias may be formed by drilling through the circuit board and coating the inner surface with a conductive material. According to existing processes, a hole may be drilled through the entire board, even if a targeted layer (i.e., a signal trace) is located inside the board, leaving an unused portion of the via (referred to as a via stub).

Via stubs may be problematic because they can be a source of resonance in the signal path, which causes extra signal loss. Faster signals with higher frequency content (e.g., greater than about 4 Gb/s or 2 GHz) may have increasing loss due to the resonance in via stubs. Circuit boards having a higher stackup (e.g., in multi-CPU servers) may experience more resonance even at lower frequencies because longer stubs reflect more energy. Multiple stubs within a channel (i.e., between two electronic components) may produce re-reflections causing noise or interference with the signal transmitted by the channel.

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art. Accordingly, it is intended that the claimed subject matter be viewed broadly.

DETAILED DESCRIPTION

Figure 1:
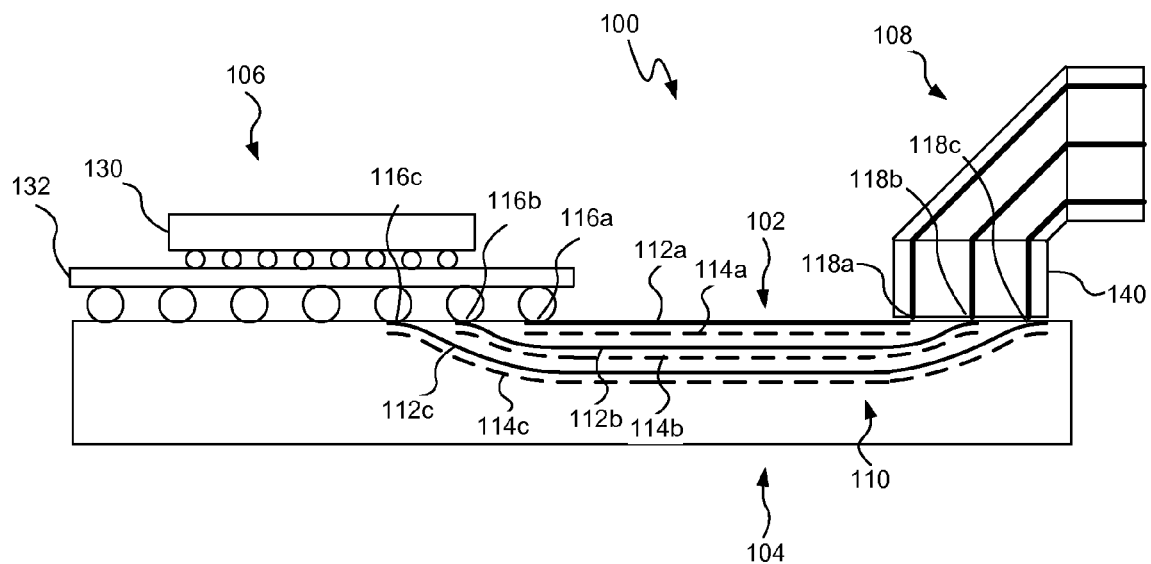
FIG. 1 is a side schematic view of a circuit board including stubless signal paths, consistent with one embodiment of the present disclosure.

Referring to FIG. 1, a circuit board 100 may include first and second sides 102, 104 and a plurality of circuit board layers 110 between the first and second sides 102, 104. The circuit board layers 110 may include signal traces 112a-112c electrically connecting electronic components 106, 108 mounted to at least one side 102 of the circuit board 100. The circuit board layers 110 and the signal traces 112a-112c extend from one component connection region at the first side 102 (e.g., from component 106), through the circuit board 100, to another component connection region at the first side 102 (e.g., to the component 108). Because the signal traces 112a-112c extend directly to the side 102 of the circuit board 100, vias are not necessary to connect the electronic components 106, 108 to the signal traces 112a-112c. The signal traces 112a-112c thus provide stubless signal paths between the electronic components 106, 108.

In one embodiment, the circuit board layers 110 may be made of a dielectric material and the signal traces 112a-112c may be made of copper, as described in greater detail below. The circuit board layers 110 may also include ground paths 114a-114c (e.g., ground planes) spaced from the respective signal traces 112a-112c. The ground paths 114a-114c may also extend generally from one component connection region to another component connection region of the circuit board 100. The ground paths 114a-114c may serve as ground reference planes and may be coupled together using vias, such as plated through-hole vias or stubless vias. The circuit board 100 may further include electrical contacts 116a-116c and 118a-118c, such as contact pads, at the end points of the signal traces 112a-112c. The electrical contacts 116a-116c and 118a-118c are located on the side 102 of the circuit board 100 to provide electrical contact between the electronic components 106, 108 and the respective signal traces 112a-112c.

The stubless signal paths provided by the signal traces 112a-112c may form communication channels between the electronic components 106, 108. One embodiment of the electronic component 106 may include a processor chip 130 and a chip package/substrate 132. One embodiment of the electronic component 108 may include an electrical connector 140 configured to connect the circuit board 100 to another component or circuit board. In other embodiments, the signal traces 112a-112c may be used to connect two chip packages (e.g., a chip-to-chip connection), two electrical connectors, and/or any other combination of electronic components capable of being coupled to a circuit board. The electronic components 106, 108 may include solderable pads for electrically connecting to the electrical contacts 116a-116c and 118a-118c. In addition to solderable pads, the electronic components 106, 108 may be electrically connected using other techniques, such as non-soldered or partially soldered spring contacts.

For purposes of clarity, FIG. 1 is not drawn to scale and shows only three layers 110 including three signal traces 112a-112c. Those skilled in the art will recognize that a circuit board including stubless signal paths may be constructed, according to the methods described below, to have different numbers of layers and signal traces. The circuit board may also have different configurations and sizes known to those skilled in the art, and the signal traces may have different lengths and routes through the circuit board depending upon the locations of the electronic components being connected. A circuit board consistent with the present disclosure may also include signal paths including conventional vias (e.g., with stubs) in addition to the stubless signal paths. In one embodiment, for example, stubless signal paths may be used for high speed signals (e.g., greater than about 4 Gb/s) or other signal paths that may be susceptible to resonance and conventional signal traces with vias may be used for non-critical signal paths (e.g., power grid connections or low speed control signals).

Figure 2A:
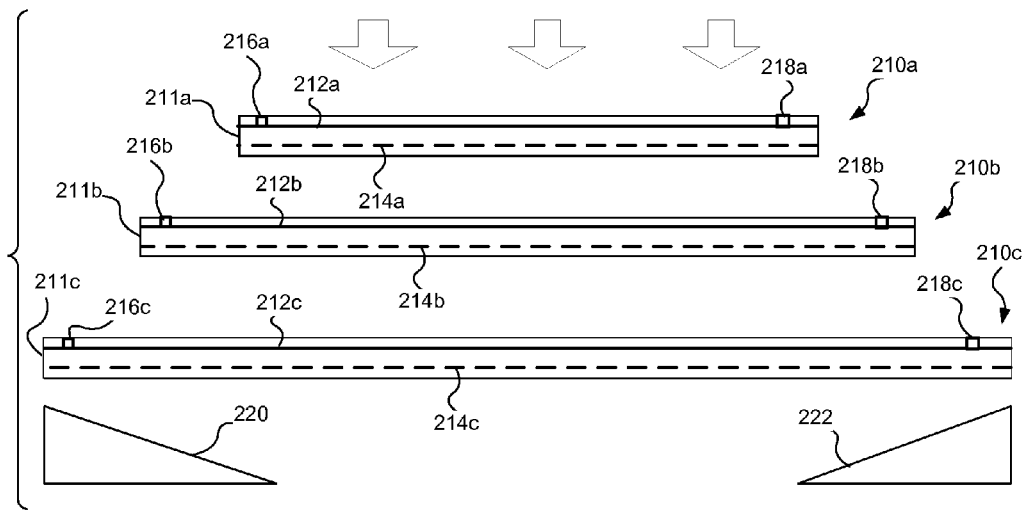
FIGS. 2A-2C are a side schematic views illustrating a method of making a circuit board including stubless signal paths, consistent with one embodiment of the present disclosure.
Figure 2B:
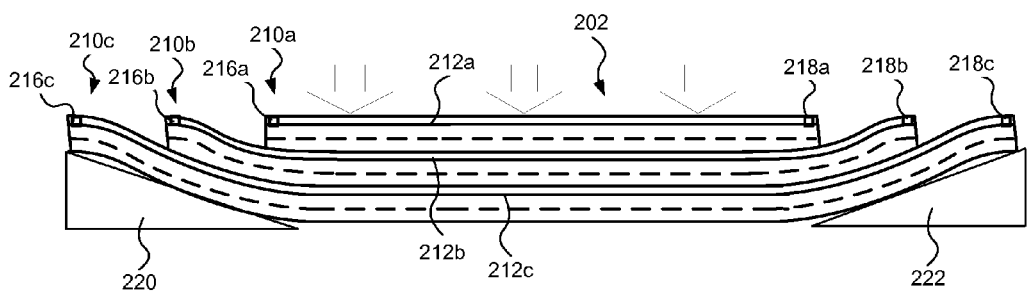
Figure 2C:
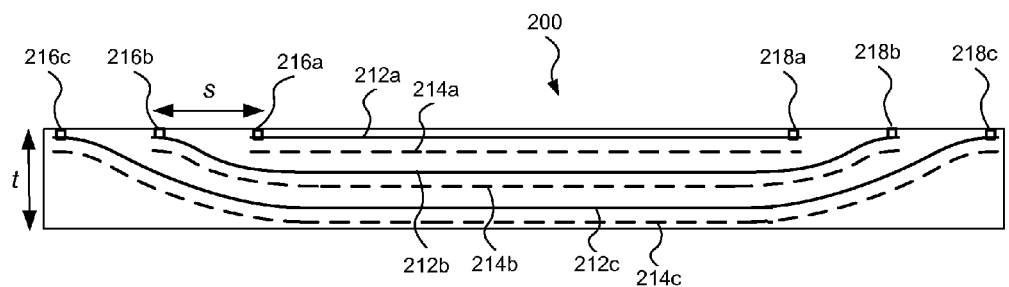

Referring to FIGS. 2A-2C, one method of making a circuit board including stubless signal paths is described in greater detail. The method may include providing a plurality of flexible circuit layers 210a-210c including a dielectric material 211a-211c and signal traces 212a-212c formed on or in the dielectric material 211a-211c. The flexible circuit layers 210a-210c may also include ground paths 214a-214c. A flexible circuit layer has sufficient flexibility to allow portions of the circuit layer to be deformed and raised to one side of the circuit board, as described in greater detail below. In one example, the flexible circuit layer includes at least portions with sufficient flexibility to allow a deformation angle of about 45° or less. The flexible circuit layers 210a-210c may be flexible only in the portions that need to be deformed (e.g., at the ends) or may be flexible along the entire length of the flexible circuit layers 210a-210c. Although the top layer is described as a flexible circuit layer 210a, this layer 210a may not need to deform and thus may not be flexible in some embodiments.

In one embodiment, the flexible circuit layers 210a-210c may be similar to segments of flexible interconnect (also referred to as flexible printed wire or flex) known to those skilled in the art. The dielectric materials used in the flexible circuit layers 210a-210c may include any dielectric materials capable of providing the desired flexibility or deformation angle. The dielectric material provided between the signal traces 212a-212c and the ground paths 214a-214c may also be relatively incompressible to maintain acceptable signal trace-ground plane spacing. Those skilled in the art will recognize an acceptable range of compressibility. To provide the desired flexibility and incompressibility, the flexible circuit layers 210a-210c may have a standard flame retardant type 4 (FR-4) construction including a dielectric between the signal traces 212a-212c and ground paths 214a-214c of either prepreg or polyamide, or similar material such as epoxy-based materials or PTFE or similar materials. One example of a polyamide dielectric that may be used includes the polyamide flexible laminate available under the name Pyralux® AP from DuPont™. In one embodiment, a single one of the flexible circuit layers 210a-210c may have a thickness in a range of about 5-20 mils, although different stackups are possible depending on trace dimensions. The copper traces may be formed on or in the flexible circuit layers 210a-210c using techniques known to those skilled in the art.

The signal traces 212a-212c may extend from one flexible portion to another flexible portion of the flexible circuit layers 210a-210c (e.g., from one end to another end). The flexible circuit layers 210a-210c may also include electrical contacts 216a-216c and 218a-218c, such as contact pads, at the end points of the signal traces 212a-212c to provide electrical contact to the respective signal traces 212a-212c. The electrical contacts 216a-216c and 218a-218c may be formed using conductive material connected to the traces 212a-212c, for example, after the lamination process. Alternatively, the electrical contacts 216a-216c may be ends of the traces 212a-212c, which may be exposed, for example, by creating an opening in the top cover layer of the dielectric. The ends of the flexible circuit layers 210a-210c may be staggered to allow the electrical contacts 216a-216c at the ends of the signal traces 212a-212c to be moved or raised to one side of the circuit board, as described below. In the exemplary embodiment, the flexible circuit layers 210a-210c have different sizes and are positioned in a layered arrangement according to size (e.g., with smaller sized circuit board layers on top of larger sized circuit board layers), which results in staggering of the ends of the flexible circuit layers 210a-210c.

When the flexible circuit layers 210a-210c are stacked in the layered arrangement, as shown in FIG. 2B, the flexible portions (e.g., the ends) of the flexible circuit layers 210a-210c may be moved or raised toward one side 202 of the stack or layered arrangement. In one embodiment, shims 220, 222 may be used to move the flexible portions of the flexible circuit layers 210a-210c toward the side 202 of the stack. In one embodiment, the shims 220, 222 may have an angled surface with an angle corresponding to a desired deformation angle of the flexible circuit layers 210a-210c, for example, less than about 45°. Other shapes and configurations of the shims 220, 222 may be used depending upon the desired deformation and alignment of the electrical contacts 216a-216c and 218a-218c. The shims 220, 222 may be made of the same dielectric material (e.g., polyamide) as used for the circuit board layers 210a-210c.

When the flexible circuit layers 210a-210c are stacked with the flexible portions raised toward the one side 202 and the electrical contacts 216a-216c and 218a-218c properly aligned, the flexible circuit layers 210a-210c may be laminated together. To laminate the flexible circuit layers 210a-210c, pressure and heat may be applied to the stack until the flexible circuit layers 210a-210b bond with adjacent layers. The laminated flexible circuit layers 210a-210c form the circuit board 200, as shown in FIG. 2C. In one embodiment, pressure may be applied in a range of about 200 psi and heat may be applied in a range of about 150-200° C. using lamination equipment and techniques known to those skilled in the art. Other pressures and temperatures may be used depending upon the materials used. The shims 220, 222 may also be laminated together with the flexible circuit layers 210a-210c. Heating and pressing may also be performed such that some melting occurs in the dielectric material to facilitate planarizing the circuit board.

The resulting circuit board 200 may have a thickness t in a range of about 50-60 mils and a spacing s between the electrical contacts 216a-216c and 218a-218c in a range of about 40-60 mils. The spacing and positioning of the electrical contacts 216a-216c and 218a-218c generally correspond to the spacing and positioning of the mating contacts (e.g., solderable pads) on a corresponding electronic component to be mounted to the circuit board 200. To provide a spacing and positioning that corresponds to an electronic component, the electrical contacts 216a-216c and 218a-218c may be aligned when the flexible circuit layers 210a-210c are stacked in the layered arrangement. This alignment of the electrical contacts 216a-216c and 218a-218c may account for any shifting caused by deformation of the flexible circuit layers 210a-210c, as described below.

Figure 3:
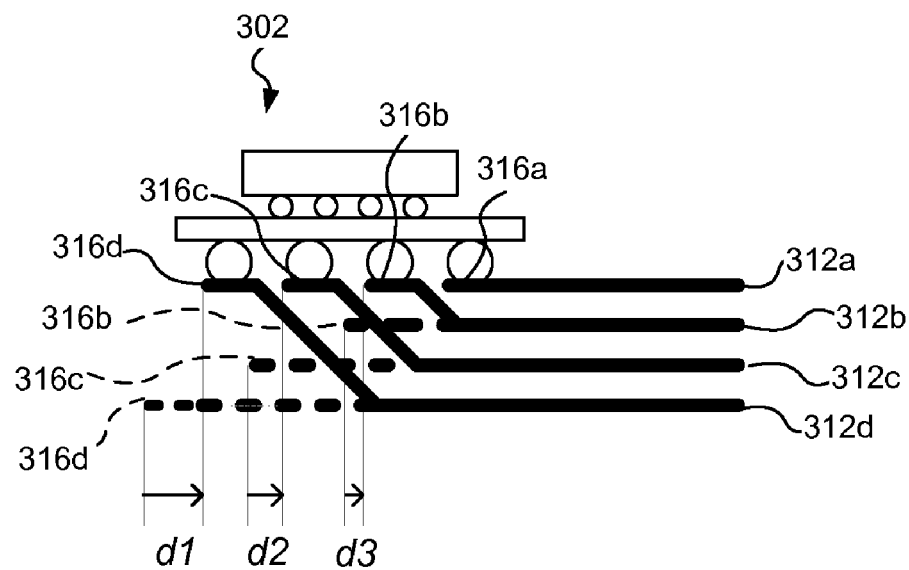
FIG. 3 is a side schematic view of an electronic component coupled to signal traces in a circuit board, consistent with one embodiment of the present disclosure, illustrating a shift in horizontal position of the endpoints of the signal traces.

When the flexible circuit layers are pressed to raise the flexible portions to one side, the deformation of the flexible circuit layers causes the horizontal position of some of the electrical contacts 316a-316c to shift, as shown in FIG. 3. The electrical contact 316d of the signal trace 312d shifts horizontally by a distance of d1, the electrical contact 316c of the signal trace 312c shifts horizontally by a distance of d2, and the electrical contact 316b of the signal trace 312b shifts horizontally by a distance of d3. As illustrated, the extent of the shift is greater for layers that are deformed by a greater extent. The shift d1 of the electrical contact 316d in the lowermost layer, for example, is greater than the shifts d2 and d3 of the electrical contacts 316c,316b in the other layers. Thus, the shifting may be greater for thicker stacks of flexible circuit layers. Because the top layer is not deflected in this embodiment, the electrical contact 316a of the signal trace 312a does not shift horizontally as a result of deflection.

These horizontal shifts may be taken into consideration when the flexible circuit layers including the signal traces 312a-312d are stacked. In other words, the electrical contacts 316a-316c are aligned with an original spacing and positioning in the layered arrangement of flexible circuit layers such that the electrical contacts 316a-316c in the resulting circuit board have a spacing and positioning corresponding to the spacing and positioning of the corresponding contacts on the electronic component 302. The original spacing and positioning is equivalent to the desired spacing and positioning plus the horizontal shift amounts d1, d2, and d3.

Figure 4:
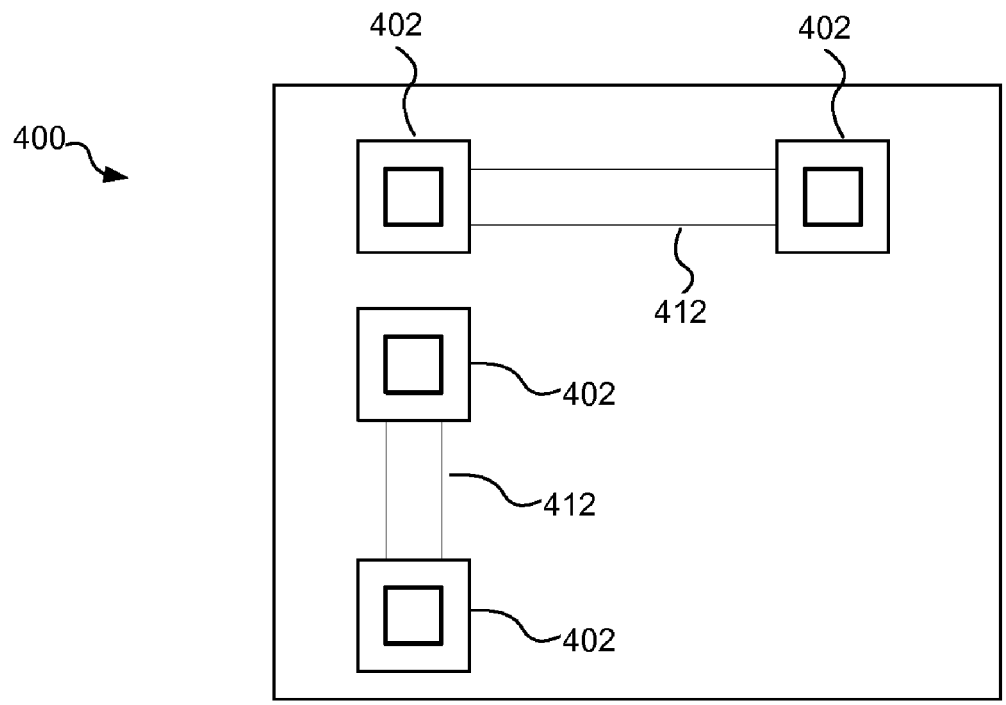
FIG. 4 is a schematic plan view of a circuit board including stubless signal paths providing a chip-to-chip link, consistent with one embodiment of the present disclosure.

In one embodiment, shown in FIG. 4, a circuit board 400 may include one or more groups of signal traces 412 that provide stubless signal paths between chips/packages 402 and/or other electronic components mounted on the circuit board 400. In this embodiment, at least a portion of the circuit board 400 may be formed by laminating flexible circuit layers, as described above. The flexible portions that are raised to one side of the circuit board 400, as described above, may be located in the component connection regions of the circuit board 400 where the chips/packages 402 or other electronic components are to be mounted. In the illustrated embodiment of a multiple chip circuit board 400, the signal traces 412 provide stubless signal paths in multiple transverse directions, for example, with one group of signal traces 412 extending in the X direction and another group of signal traces 412 extending in the Y directions. Signal traces may also provide stubless signal paths along a single dimension (e.g., for a single chip-to-chip link). Although the signal traces 412 are shown as straight in the illustrated embodiment, the signal traces 412 may also be routed in different directions.

Figure 5:
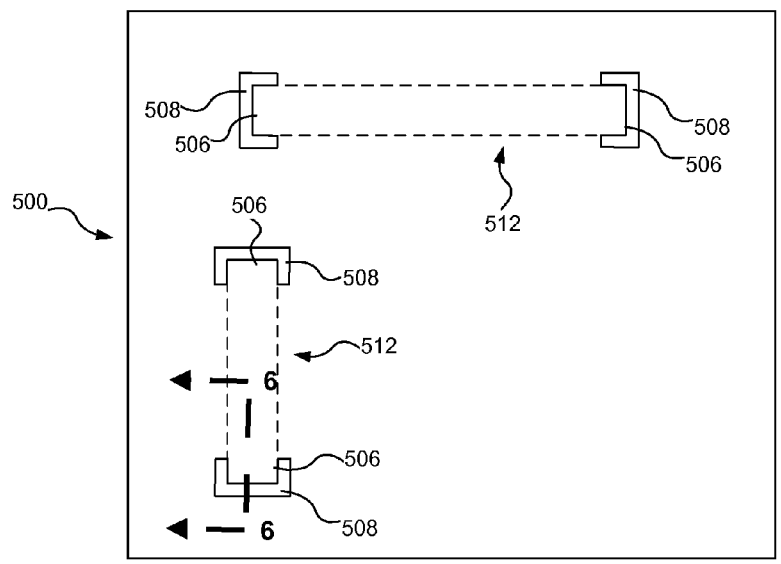
FIG. 5 is a schematic plan view of a circuit board including cutout regions around the ends of the stubless signal paths, consistent with one embodiment of the present disclosure.
Figure 6:
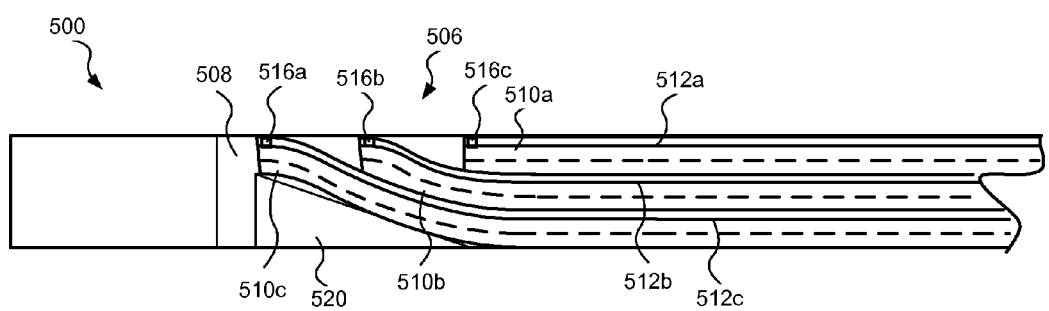
FIG. 6 is a schematic cross-sectional side view of the cutout regions shown in FIG. 5.

Referring to FIGS. 5 and 6, one method of constructing a circuit board 500 capable of providing multiple chip or component connections is described in greater detail. The circuit board 500 may be constructed by providing flexible portions 506 to be deformed or raised in the component connection regions. Signal traces 512 in the circuit board may extend between the flexible portions 506. In this embodiment, the circuit board 500 may include cutout regions 508 around the flexible portions 506 such that deformation of the flexible portions 506 is localized. Localizing the deformation facilitates formation of signal traces 512 in transverse directions (e.g., in both the X and Y directions) with proper alignment of the electrical contacts.

As shown in FIG. 6, one or more shims 520 may be used to raise the flexible portions 506 to one side of the circuit board 500, as described above. The flexible portions 506 being raised include the electrical contacts 516a-516c connected to the signal traces 512a-512c in the respective flexible circuit layers 510a-510c. The cutout region 508 allows the flexible portions of the respective flexible circuit layers 510a-510c to be raised separately from the surrounding portion of the circuit board 500, thereby minimizing or eliminating localized "hills" on the circuit board. In one embodiment, the entire circuit board 500 may be formed of laminated flexible circuit layers. In other embodiments, one or more layers or portions of the circuit board 500 may be formed of other circuit board constructions known to those skilled in the art. After raising the flexible portions 506 with the electrical contacts 516a-516c having the desired alignment, the flexible circuit layers 510a-510c may be laminated together as described above.

Figure 7:
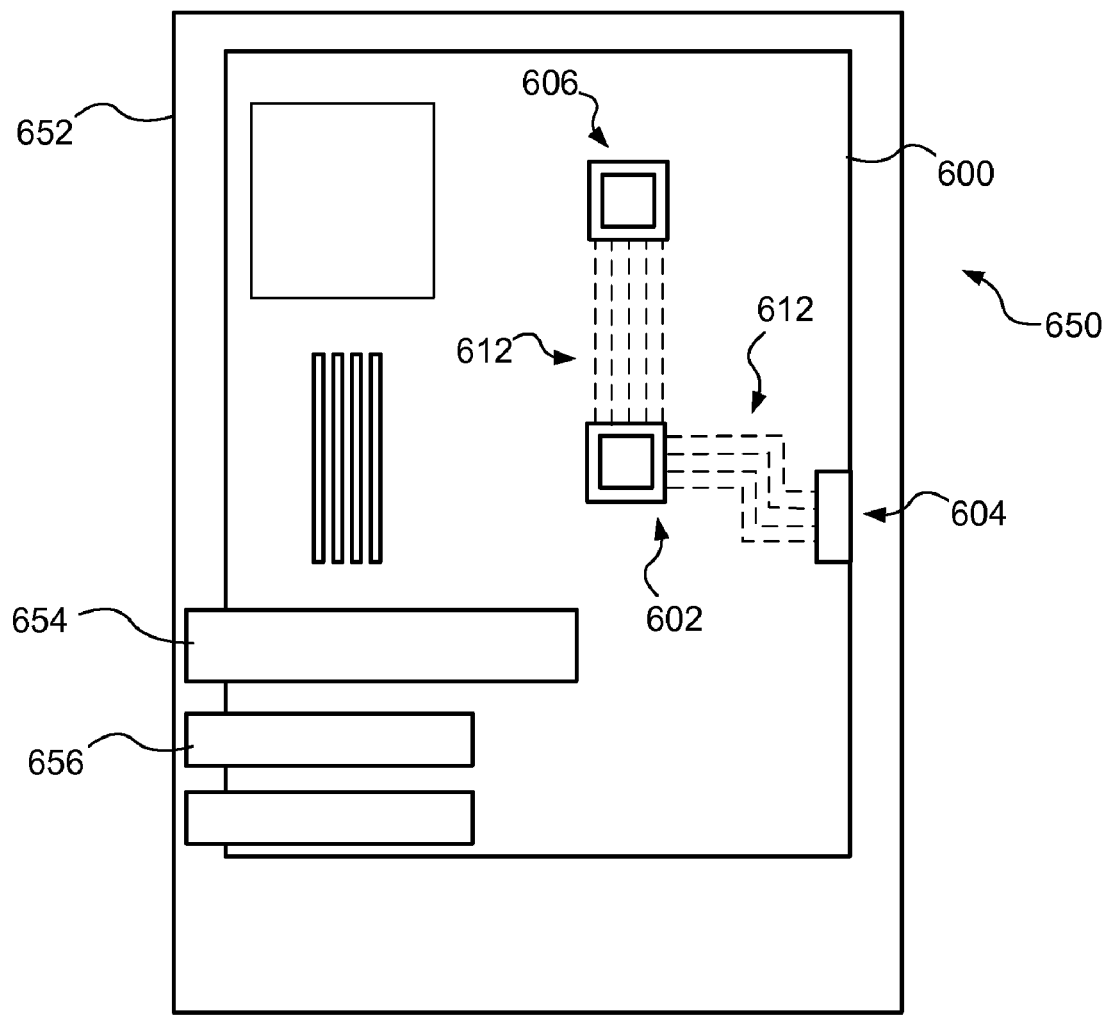
FIG. 7 is a side schematic view of a computer system including a mother board including stubless signal paths, consistent with another embodiment of the present disclosure.

Referring to FIG. 7, a computer system 650, such as a personal computer, may include a mother board 600 including signal traces 612 forming one or more stubless signal paths connecting one or more electronic components, such as chips 602, 606 and/or connectors 604. The circuit board 600 including the signal traces 612 may be constructed by forming a layered arrangement and laminating flexible circuit layers, as described above. The computer system 650 may also include a chassis 652 enclosing the mother board 600 and one or more computer devices 654, 656, such as a hard drive and/or an optical drive.

According to alternative embodiments, a circuit board including signal traces forming stubless signal paths, consistent with embodiments of the present disclosure, may be used in modular platforms, such as an advanced telecommunications computing architecture (Advanced TCA or ATCA) system. Circuit boards including signal traces forming stubless signal paths, consistent with embodiments of the present disclosure, may also be used in servers, mobile products and consumer products.

Consistent with one embodiment, an apparatus includes a circuit board including first and second sides and a plurality of circuit board layers between the first and second sides. The circuit board layers include a plurality of signal traces located in respective ones of the circuit board layers. The circuit board layers and the respective signal traces extend from a first component connection region at the first side of the circuit board to a second component connection region at the first side of the circuit board. The signal traces form stubless signal paths through the circuit board between the component connection regions.

Consistent with another embodiment, a method includes providing a plurality of flexible circuit layers. The flexible circuit layers include a dielectric material and respective signal traces extending from first flexible portions to second flexible portions of the respective flexible circuit layers. The method includes positioning the flexible circuit layers in a layered arrangement such that the first and second flexible portions of the flexible circuit layers are raised to one side of the layered arrangement. The method further includes laminating the flexible circuit layers together to form a circuit board structure having first and second sides. The laminated flexible circuit layers form circuit board layers and the signal traces form stubless circuit board signal paths extending from a first component connection region at the first side of the circuit board to a second component connection region at the first side of the circuit board.

Consistent with a further embodiment, a computer includes a chassis and a mother board located in the chassis. The mother board includes first and second sides and a plurality of circuit board layers between the first and second sides. The circuit board layers include a plurality of signal traces located in respective ones of the circuit board layers. The circuit board layers and the respective signal traces extend from a first component connection region at the first side of the circuit board to a second component connection region at the first side of the circuit board. The signal traces form stubless signal paths through the circuit board between the component connection regions. The computer further includes at least first and second electronic components mounted on the mother board. The first and second electronic components are electrically connected to at least some of the signal traces at the first and second component connection regions, respectively.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. An apparatus comprising:
a circuit board including first and second sides and a plurality of circuit board layers between the first and second sides, the circuit board layers including a plurality of signal traces located in respective ones of the circuit board layers and extending with the circuit board layers to the first side of the circuit board, the circuit board layers and the respective signal traces extending from a first component connection region at the first side of the circuit board to a second component connection region at the first side of the circuit board, by extending to the first side of the circuit board the signal traces form stubless signal paths through the circuit board between the component connection regions without using vias to connect the component connection regions to the signal traces.

2. The apparatus of claim 1 further comprising contact pads in the component connection regions at the first side of the circuit board, the signal traces in the circuit board layers extending from and electrically connected to respective ones of the contact pads.

3. The apparatus of claim 1 further comprising electronic components mounted to the circuit board and electrically connected to at least some of the signal traces at the component connection regions.

4. The apparatus of claim 1 further comprising at least two groups of the signal traces.

5. The apparatus of claim 1 wherein the circuit board layers include a plurality of ground paths located in respective ones of the circuit board layers.

6. The apparatus of claim 1 wherein the circuit board layers include a plurality of laminated flexible circuit layers.

7. The apparatus of claim 1 wherein the circuit board layers include layers of dielectric material.

8. The apparatus of claim 1 wherein said circuit board is a mother board.

9. The apparatus of claim 3 wherein the electronic components include multiple chips.

10. The apparatus of claim 4 wherein the two groups of the signal traces extend in directions that are transverse to one another.

11. The apparatus of claim 7 wherein the signal traces include copper traces formed on or in the dielectric material.

12. The apparatus of claim 7 wherein the dielectric material includes at least one of a dielectric material selected from the group consisting of polyimide and prepreg.

* * * * *